United States Patent
Kahn et al.

(10) Patent No.: US 8,285,344 B2
(45) Date of Patent: Oct. 9, 2012

(54) METHOD AND APPARATUS FOR ADJUSTING AUDIO FOR A USER ENVIRONMENT

(75) Inventors: Philippe Kahn, Aptos, CA (US); Arthur Kinsolving, Santa Cruz, CA (US)

(73) Assignee: DP Technlogies, Inc., Scotts Valley, CA (US)

( * ) Notice: Subject to any disclaimer, the term of this patent is extended or adjusted under 35 U.S.C. 154(b) by 130 days.

(21) Appl. No.: 12/469,633

(22) Filed: May 20, 2009

(65) Prior Publication Data

US 2009/0290718 A1 Nov. 26, 2009

Related U.S. Application Data

(60) Provisional application No. 61/055,137, filed on May 21, 2008.

(51) Int. Cl.
*H04M 1/00* (2006.01)
*H04B 1/38* (2006.01)

(52) U.S. Cl. .................. 455/570; 455/414.1; 455/456.1; 361/56; 361/57

(58) Field of Classification Search .................. 455/570, 455/63.1, 414.1, 456.1, 501, 550.1, 556.1; 381/56, 57
See application file for complete search history.

(56) References Cited

U.S. PATENT DOCUMENTS

| | | |
|---|---|---|
| 4,285,041 A | 8/1981 | Smith |
| 4,571,680 A | 2/1986 | Wu |
| 4,578,769 A | 3/1986 | Frederick |
| 4,700,369 A | 10/1987 | Seigal et al. |
| 4,776,323 A | 10/1988 | Spector |
| 5,313,060 A | 5/1994 | Gast et al. |
| 5,386,210 A | 1/1995 | Lee |
| 5,430,480 A | 7/1995 | Allen et al. |
| 5,446,725 A | 8/1995 | Ishiwatari |
| 5,446,775 A | 8/1995 | Wright et al. |
| 5,454,114 A | 9/1995 | Yach et al. |
| 5,506,987 A | 4/1996 | Abramson et al. |
| 5,583,776 A | 12/1996 | Levi et al. |
| 5,593,431 A | 1/1997 | Sheldon |
| 5,654,619 A | 8/1997 | Iwashita |
| 5,737,439 A | 4/1998 | Lapsley et al. |
| 5,771,001 A | 6/1998 | Cobb |
| 5,778,882 A | 7/1998 | Raymond et al. |
| 5,911,065 A | 6/1999 | Williams et al. |

(Continued)

FOREIGN PATENT DOCUMENTS

EP 1 104 143 5/2001

(Continued)

OTHER PUBLICATIONS

International Search Report and Written Opinion, PCT/US2009/044914, mailed Aug. 27, 2009, 8 pgs.

(Continued)

*Primary Examiner* — Tuan H Nguyen
(74) *Attorney, Agent, or Firm* — Blakely, Sokoloff, Taylor & Zafman LLP; Judith A. Szepesi (57) ABSTRACT

The method defines a user environment based on detected motion data and/or ambient noise data. The user environment is then used to apply an appropriate audio adjustment mode. In one embodiment, the user environment definition further includes location data. In one embodiment, the location data is obtained from one of: a global positioning system (GPS), and network triangulation.

22 Claims, 7 Drawing Sheets

U.S. PATENT DOCUMENTS

| | | |
|---|---|---|
| 5,955,667 A | 9/1999 | Fyfe |
| 5,960,085 A | 9/1999 | de la Huerga |
| 5,976,083 A | 11/1999 | Richardson et al. |
| 6,013,007 A | 1/2000 | Root et al. |
| 6,061,456 A | 5/2000 | Andrea et al. |
| 6,122,595 A | 9/2000 | Varley et al. |
| 6,135,951 A | 10/2000 | Richardson et al. |
| 6,145,389 A | 11/2000 | Ebeling et al. |
| 6,246,321 B1 | 6/2001 | Rechsteiner et al. |
| 6,282,496 B1 | 8/2001 | Chowdhary |
| 6,353,449 B1 | 3/2002 | Gregg et al. |
| 6,369,794 B1 | 4/2002 | Sakurai et al. |
| 6,396,883 B2 | 5/2002 | Yang et al. |
| 6,408,330 B1 | 6/2002 | de la Huerga |
| 6,428,490 B1 | 8/2002 | Kramer et al. |
| 6,470,147 B1 | 10/2002 | Imada |
| 6,478,736 B1 | 11/2002 | Mault |
| 6,493,652 B1 | 12/2002 | Ohlenbusch et al. |
| 6,496,695 B1 | 12/2002 | Kouji et al. |
| 6,513,381 B2 | 2/2003 | Fyfe et al. |
| 6,522,266 B1 | 2/2003 | Soehren et al. |
| 6,532,419 B1 | 3/2003 | Begin et al. |
| 6,539,336 B1 | 3/2003 | Vock et al. |
| 6,595,929 B2 | 7/2003 | Stivoric et al. |
| 6,607,493 B2 | 8/2003 | Song |
| 6,611,789 B1 | 8/2003 | Darley |
| 6,628,898 B2 | 9/2003 | Endo |
| 6,634,992 B1 | 10/2003 | Ogawa |
| 6,665,802 B1 | 12/2003 | Ober |
| 6,672,991 B2 | 1/2004 | O'Malley |
| 6,685,480 B2 | 2/2004 | Nishimoto et al. |
| 6,700,499 B2 | 3/2004 | Kubo et al. |
| 6,731,958 B1 | 5/2004 | Shirai |
| 6,766,176 B1 * | 7/2004 | Gupta et al. ............... 455/550.1 |
| 6,771,250 B1 | 8/2004 | Oh |
| 6,786,877 B2 | 9/2004 | Foxlin |
| 6,788,980 B1 | 9/2004 | Johnson |
| 6,790,178 B1 | 9/2004 | Mault et al. |
| 6,813,582 B2 | 11/2004 | Levi et al. |
| 6,823,036 B1 | 11/2004 | Chen |
| 6,826,477 B2 | 11/2004 | Ladetto et al. |
| 6,836,744 B1 | 12/2004 | Asphahani et al. |
| 6,881,191 B2 | 4/2005 | Oakley et al. |
| 6,885,971 B2 | 4/2005 | Vock et al. |
| 6,898,550 B1 | 5/2005 | Blackadar et al. |
| 6,928,382 B2 | 8/2005 | Hong et al. |
| 6,941,239 B2 | 9/2005 | Unuma et al. |
| 6,959,259 B2 | 10/2005 | Vock et al. |
| 6,975,959 B2 | 12/2005 | Dietrich et al. |
| 7,010,332 B1 | 3/2006 | Irvin et al. |
| 7,020,487 B2 | 3/2006 | Kimata |
| 7,027,087 B2 | 4/2006 | Nozaki et al. |
| 7,028,547 B2 | 4/2006 | Shiratori et al. |
| 7,042,509 B2 | 5/2006 | Onuki |
| 7,054,784 B2 | 5/2006 | Flentov et al. |
| 7,057,551 B1 | 6/2006 | Vogt |
| 7,072,789 B2 | 7/2006 | Vock et al. |
| 7,092,846 B2 | 8/2006 | Vock et al. |
| 7,096,619 B2 | 8/2006 | Jackson et al. |
| 7,148,797 B2 | 12/2006 | Albert |
| 7,155,507 B2 | 12/2006 | Hirano et al. |
| 7,158,912 B2 | 1/2007 | Vock et al. |
| 7,169,084 B2 | 1/2007 | Tsuji |
| 7,171,331 B2 | 1/2007 | Vock et al. |
| 7,173,604 B2 | 2/2007 | Marvit et al. |
| 7,176,886 B2 | 2/2007 | Marvit et al. |
| 7,176,887 B2 | 2/2007 | Marvit et al. |
| 7,176,888 B2 | 2/2007 | Marvit et al. |
| 7,177,684 B1 | 2/2007 | Kroll et al. |
| 7,180,500 B2 | 2/2007 | Marvit et al. |
| 7,180,501 B2 | 2/2007 | Marvit et al. |
| 7,180,502 B2 | 2/2007 | Marvit et al. |
| 7,200,517 B2 | 4/2007 | Darley et al. |
| 7,212,230 B2 | 5/2007 | Stavely |
| 7,212,943 B2 | 5/2007 | Aoshima et al. |
| 7,220,220 B2 | 5/2007 | Stubbs et al. |
| 7,254,516 B2 | 8/2007 | Case et al. |
| 7,280,096 B2 | 10/2007 | Marvit et al. |
| 7,297,088 B2 | 11/2007 | Tsuji |
| 7,301,526 B2 | 11/2007 | Marvit et al. |
| 7,301,527 B2 | 11/2007 | Marvit et al. |
| 7,301,528 B2 | 11/2007 | Marvit et al. |
| 7,301,529 B2 | 11/2007 | Marvit et al. |
| 7,328,611 B2 | 2/2008 | Klees et al. |
| 7,334,472 B2 | 2/2008 | Seo et al. |
| 7,353,112 B2 | 4/2008 | Choi et al. |
| 7,365,735 B2 | 4/2008 | Reinhardt et al. |
| 7,365,736 B2 | 4/2008 | Marvit et al. |
| 7,365,737 B2 | 4/2008 | Marvit et al. |
| 7,379,999 B1 | 5/2008 | Zhou et al. |
| 7,387,611 B2 | 6/2008 | Inoue et al. |
| 7,397,357 B2 | 7/2008 | Krumm et al. |
| 7,451,056 B2 | 11/2008 | Flentov et al. |
| 7,457,719 B1 | 11/2008 | Kahn et al. |
| 7,457,872 B2 | 11/2008 | Aton et al. |
| 7,467,060 B2 | 12/2008 | Kulach et al. |
| 7,512,515 B2 | 3/2009 | Vock et al. |
| 7,526,402 B2 | 4/2009 | Tanenhaus et al. |
| 7,608,050 B2 | 10/2009 | Sugg |
| 7,640,804 B2 | 1/2010 | Daumer et al. |
| 7,647,196 B2 | 1/2010 | Kahn et al. |
| 7,653,508 B1 | 1/2010 | Kahn et al. |
| 7,664,657 B1 | 2/2010 | Letzt et al. |
| 7,689,107 B2 | 3/2010 | Enomoto |
| 7,705,884 B2 | 4/2010 | Pinto et al. |
| 7,752,011 B2 | 7/2010 | Niva et al. |
| 7,753,861 B1 | 7/2010 | Kahn et al. |
| 7,765,553 B2 | 7/2010 | Douceur et al. |
| 7,774,156 B2 | 8/2010 | Niva et al. |
| 7,857,772 B2 | 12/2010 | Bouvier et al. |
| 7,881,902 B1 | 2/2011 | Kahn et al. |
| 7,892,080 B1 | 2/2011 | Dahl |
| 7,987,070 B2 | 7/2011 | Kahn et al. |
| 2001/0047488 A1 | 11/2001 | Verplaetse et al. |
| 2002/0006284 A1 | 1/2002 | Kim |
| 2002/0023654 A1 | 2/2002 | Webb |
| 2002/0027164 A1 | 3/2002 | Mault et al. |
| 2002/0054214 A1 | 5/2002 | Yoshikawa |
| 2002/0089425 A1 | 7/2002 | Kubo et al. |
| 2002/0109600 A1 | 8/2002 | Mault et al. |
| 2002/0118121 A1 | 8/2002 | Lehrman et al. |
| 2002/0138017 A1 | 9/2002 | Bui et al. |
| 2002/0142887 A1 | 10/2002 | O'Malley |
| 2002/0150302 A1 | 10/2002 | McCarthy et al. |
| 2002/0151810 A1 | 10/2002 | Wong et al. |
| 2002/0173295 A1 | 11/2002 | Nykanen et al. |
| 2002/0190947 A1 | 12/2002 | Feinstein |
| 2003/0018430 A1 | 1/2003 | Ladetto et al. |
| 2003/0033411 A1 | 2/2003 | Kavoori et al. |
| 2003/0048218 A1 | 3/2003 | Milnes et al. |
| 2003/0083596 A1 | 5/2003 | Kramer et al. |
| 2003/0093187 A1 | 5/2003 | Walker et al. |
| 2003/0101260 A1 | 5/2003 | Dacier et al. |
| 2003/0109258 A1 | 6/2003 | Mantyjarvi et al. |
| 2003/0139692 A1 | 7/2003 | Barrey et al. |
| 2003/0139908 A1 | 7/2003 | Wegerich et al. |
| 2003/0149526 A1 | 8/2003 | Zhou et al. |
| 2003/0151672 A1 | 8/2003 | Robins et al. |
| 2003/0187683 A1 | 10/2003 | Kirchhoff et al. |
| 2003/0208110 A1 | 11/2003 | Mault et al. |
| 2003/0208113 A1 | 11/2003 | Mault et al. |
| 2003/0227487 A1 | 12/2003 | Hugh |
| 2003/0236625 A1 | 12/2003 | Brown et al. |
| 2004/0017300 A1 | 1/2004 | Kotzin et al. |
| 2004/0024846 A1 | 2/2004 | Randall et al. |
| 2004/0043760 A1 | 3/2004 | Rosenfeld et al. |
| 2004/0044493 A1 | 3/2004 | Coulthard |
| 2004/0047498 A1 | 3/2004 | Mulet-Parada et al. |
| 2004/0078219 A1 | 4/2004 | Kaylor et al. |
| 2004/0078220 A1 | 4/2004 | Jackson |
| 2004/0081441 A1 | 4/2004 | Sato et al. |
| 2004/0106958 A1 | 6/2004 | Mathis et al. |
| 2004/0122294 A1 | 6/2004 | Hatlestad et al. |
| 2004/0122295 A1 | 6/2004 | Hatlestad et al. |
| 2004/0122296 A1 | 6/2004 | Hatlestad et al. |
| 2004/0122297 A1 | 6/2004 | Stahmann et al. |
| 2004/0122333 A1 | 6/2004 | Nissila |

| | | |
|---|---|---|
| 2004/0122484 A1 | 6/2004 | Hatlestad et al. |
| 2004/0122485 A1 | 6/2004 | Stahmann et al. |
| 2004/0122486 A1 | 6/2004 | Stahmann et al. |
| 2004/0122487 A1 | 6/2004 | Hatlestad et al. |
| 2004/0125073 A1 | 7/2004 | Potter et al. |
| 2004/0130628 A1 | 7/2004 | Stavely |
| 2004/0135898 A1 | 7/2004 | Zador |
| 2004/0146048 A1 | 7/2004 | Cotte |
| 2004/0148340 A1 | 7/2004 | Cotte |
| 2004/0148341 A1 | 7/2004 | Cotte |
| 2004/0148342 A1 | 7/2004 | Cotte |
| 2004/0148351 A1 | 7/2004 | Cotte |
| 2004/0185821 A1 | 9/2004 | Yuasa |
| 2004/0219910 A1 | 11/2004 | Beckers |
| 2004/0225467 A1 | 11/2004 | Vock et al. |
| 2004/0236500 A1 | 11/2004 | Choi et al. |
| 2004/0247030 A1 | 12/2004 | Wiethoff |
| 2004/0259494 A1 | 12/2004 | Mazar |
| 2005/0015768 A1 | 1/2005 | Moore |
| 2005/0027567 A1 | 2/2005 | Taha |
| 2005/0033200 A1 | 2/2005 | Soehren et al. |
| 2005/0038691 A1 | 2/2005 | Babu |
| 2005/0048955 A1 | 3/2005 | Ring |
| 2005/0078197 A1 | 4/2005 | Gonzales |
| 2005/0079873 A1 | 4/2005 | Caspi et al. |
| 2005/0101841 A9 | 5/2005 | Kaylor et al. |
| 2005/0102167 A1 | 5/2005 | Kapoor |
| 2005/0107944 A1 | 5/2005 | Hovestadt et al. |
| 2005/0113649 A1 | 5/2005 | Bergantino |
| 2005/0113650 A1 | 5/2005 | Pacione et al. |
| 2005/0131736 A1 | 6/2005 | Nelson et al. |
| 2005/0146431 A1 | 7/2005 | Hastings et al. |
| 2005/0157181 A1 | 7/2005 | Kawahara et al. |
| 2005/0165719 A1 | 7/2005 | Greenspan et al. |
| 2005/0168587 A1 | 8/2005 | Sato et al. |
| 2005/0182824 A1 | 8/2005 | Cotte |
| 2005/0183086 A1 | 8/2005 | Abe et al. |
| 2005/0202934 A1 | 9/2005 | Olrik et al. |
| 2005/0203430 A1 | 9/2005 | Williams et al. |
| 2005/0210300 A1 | 9/2005 | Song et al. |
| 2005/0212751 A1 | 9/2005 | Marvit et al. |
| 2005/0212752 A1 | 9/2005 | Marvit et al. |
| 2005/0212753 A1 | 9/2005 | Marvit et al. |
| 2005/0212760 A1 | 9/2005 | Marvit et al. |
| 2005/0222801 A1 | 10/2005 | Wulff et al. |
| 2005/0232388 A1 | 10/2005 | Tsuji |
| 2005/0232404 A1 | 10/2005 | Gaskill |
| 2005/0234676 A1 | 10/2005 | Shibayama |
| 2005/0235058 A1 | 10/2005 | Rackus et al. |
| 2005/0238132 A1 | 10/2005 | Tsuji |
| 2005/0240375 A1 | 10/2005 | Sugai |
| 2005/0243178 A1 | 11/2005 | McConica |
| 2005/0245988 A1 | 11/2005 | Miesel |
| 2005/0248718 A1 | 11/2005 | Howell et al. |
| 2005/0256414 A1 | 11/2005 | Kettunen et al. |
| 2005/0262237 A1 | 11/2005 | Fulton et al. |
| 2005/0281289 A1 | 12/2005 | Huang et al. |
| 2006/0017692 A1 | 1/2006 | Wehrenberg et al. |
| 2006/0020177 A1 | 1/2006 | Seo et al. |
| 2006/0029284 A1 | 2/2006 | Stewart |
| 2006/0063980 A1 | 3/2006 | Hwang et al. |
| 2006/0064276 A1 | 3/2006 | Ren et al. |
| 2006/0080551 A1 | 4/2006 | Mantyjarvi et al. |
| 2006/0090088 A1 | 4/2006 | Choi et al. |
| 2006/0098097 A1 | 5/2006 | Wach et al. |
| 2006/0100546 A1 | 5/2006 | Silk |
| 2006/0109113 A1 | 5/2006 | Reyes et al. |
| 2006/0136173 A1 | 6/2006 | Case et al. |
| 2006/0149516 A1 | 7/2006 | Bond et al. |
| 2006/0154642 A1 | 7/2006 | Scannell, Jr. |
| 2006/0161377 A1 | 7/2006 | Rakkola et al. |
| 2006/0161459 A9 | 7/2006 | Rosenfeld et al. |
| 2006/0167387 A1 | 7/2006 | Buchholz et al. |
| 2006/0167647 A1 | 7/2006 | Krumm et al. |
| 2006/0167943 A1 | 7/2006 | Rosenberg |
| 2006/0172706 A1 | 8/2006 | Griffin et al. |
| 2006/0204214 A1 | 9/2006 | Shah et al. |
| 2006/0206258 A1 | 9/2006 | Brooks |
| 2006/0223547 A1 | 10/2006 | Chin et al. |
| 2006/0249683 A1 | 11/2006 | Goldberg et al. |
| 2006/0256082 A1 | 11/2006 | Cho et al. |
| 2006/0257042 A1 | 11/2006 | Ofek et al. |
| 2006/0259268 A1 | 11/2006 | Vock et al. |
| 2006/0284979 A1 | 12/2006 | Clarkson |
| 2006/0288781 A1 | 12/2006 | Daumer et al. |
| 2006/0289819 A1 | 12/2006 | Parsons et al. |
| 2007/0004451 A1 | 1/2007 | Anderson |
| 2007/0005988 A1 | 1/2007 | Zhang et al. |
| 2007/0017136 A1 | 1/2007 | Mosher et al. |
| 2007/0024441 A1 | 2/2007 | Kahn et al. |
| 2007/0037605 A1 | 2/2007 | Logan |
| 2007/0038364 A1 | 2/2007 | Lee et al. |
| 2007/0040892 A1 | 2/2007 | Aoki et al. |
| 2007/0050157 A1 | 3/2007 | Kahn et al. |
| 2007/0061105 A1 | 3/2007 | Darley et al. |
| 2007/0063850 A1 | 3/2007 | Devaul et al. |
| 2007/0067094 A1 | 3/2007 | Park et al. |
| 2007/0073482 A1 | 3/2007 | Churchill et al. |
| 2007/0075127 A1 | 4/2007 | Rosenberg |
| 2007/0075965 A1 | 4/2007 | Huppi et al. |
| 2007/0082789 A1 | 4/2007 | Nissila et al. |
| 2007/0106991 A1 | 5/2007 | Yoo |
| 2007/0125852 A1 | 6/2007 | Rosenberg |
| 2007/0130582 A1 | 6/2007 | Chang et al. |
| 2007/0142715 A1 | 6/2007 | Banet et al. |
| 2007/0145680 A1 | 6/2007 | Rosenberg |
| 2007/0150136 A1 | 6/2007 | Doll et al. |
| 2007/0156364 A1 | 7/2007 | Rothkopf |
| 2007/0161410 A1 | 7/2007 | Huang et al. |
| 2007/0169126 A1 | 7/2007 | Todoroki et al. |
| 2007/0176898 A1 | 8/2007 | Suh |
| 2007/0192483 A1 | 8/2007 | Rezvani et al. |
| 2007/0208531 A1 | 9/2007 | Darley et al. |
| 2007/0213126 A1 | 9/2007 | Deutsch et al. |
| 2007/0239399 A1 | 10/2007 | Shyenblat et al. |
| 2007/0250261 A1 | 10/2007 | Soehren |
| 2007/0259685 A1 | 11/2007 | Engblom et al. |
| 2007/0259716 A1 | 11/2007 | Mattice et al. |
| 2007/0259717 A1 | 11/2007 | Mattice et al. |
| 2007/0260418 A1 | 11/2007 | Ladetto et al. |
| 2007/0260482 A1 | 11/2007 | Nurmela et al. |
| 2007/0263995 A1 | 11/2007 | Park et al. |
| 2008/0005738 A1 | 1/2008 | Imai et al. |
| 2008/0030586 A1 | 2/2008 | Helbing et al. |
| 2008/0046888 A1 | 2/2008 | Appaji |
| 2008/0052716 A1 | 2/2008 | Theurer |
| 2008/0072014 A1 | 3/2008 | Krishnan et al. |
| 2008/0082994 A1 | 4/2008 | Ito et al. |
| 2008/0113689 A1 | 5/2008 | Bailey |
| 2008/0140338 A1 | 6/2008 | No et al. |
| 2008/0153671 A1 | 6/2008 | Ogg et al. |
| 2008/0165022 A1 | 7/2008 | Herz et al. |
| 2008/0168361 A1 | 7/2008 | Forstall et al. |
| 2008/0171918 A1 | 7/2008 | Teller et al. |
| 2008/0214358 A1 | 9/2008 | Ogg et al. |
| 2008/0231713 A1 | 9/2008 | Florea et al. |
| 2008/0231714 A1 | 9/2008 | Estevez et al. |
| 2008/0232604 A1 | 9/2008 | Dufresne et al. |
| 2008/0303681 A1 | 12/2008 | Herz et al. |
| 2008/0311929 A1 | 12/2008 | Carro et al. |
| 2009/0017880 A1 | 1/2009 | Moore et al. |
| 2009/0031319 A1 | 1/2009 | Fecioru |
| 2009/0043531 A1 | 2/2009 | Kahn et al. |
| 2009/0047645 A1 | 2/2009 | Dibenedetto et al. |
| 2009/0067826 A1 | 3/2009 | Shinohara et al. |
| 2009/0088204 A1 | 4/2009 | Culbert et al. |
| 2009/0099668 A1 | 4/2009 | Lehman et al. |
| 2009/0124348 A1 | 5/2009 | Yoseloff et al. |
| 2009/0128448 A1 | 5/2009 | Riechel |
| 2009/0174782 A1 | 7/2009 | Kahn et al. |
| 2009/0213002 A1 | 8/2009 | Rani et al. |
| 2009/0234614 A1 | 9/2009 | Kahn et al. |
| 2009/0274317 A1 | 11/2009 | Kahn et al. |
| 2009/0296951 A1 | 12/2009 | De Haan |
| 2009/0319221 A1 | 12/2009 | Kahn et al. |
| 2010/0056872 A1 | 3/2010 | Kahn et al. |
| 2010/0057398 A1 | 3/2010 | Darley et al. |

FOREIGN PATENT DOCUMENTS

| EP | 0 833 537 | 7/2002 |
|---|---|---|
| JP | 7020547 A | 1/1995 |
| WO | WO 99/22338 | 5/1999 |
| WO | WO 00/63874 | 10/2000 |
| WO | WO 02/088926 | 11/2002 |

OTHER PUBLICATIONS

Bourzac, Katherine "Wearable Health Reports," Technology Review, Feb. 28, 2006, http://www.techreview.com/printer_friendly_article_aspx?id+16431, Mar. 22, 2007, 3 pages.

Cheng, et al, "Periodic Human Motion Description for Sports Video Databases," Proceedings of the Pattern Recognition, 2004, 8 pages.

Dao, Ricardo, "Inclination Sensing with Thermal Accelerometers", MEMSIC, May 2002, 3 pages.

Lee, Seon-Woo, et al., "Recognition of Walking Behaviors for Pedestrian Navigation," ATR Media Integration & Communications Research Laboratories, Kyoto, Japan, 4 pages.

Margaria, Rodolfo, "Biomechanics and Energetics of Muscular Exercise", Chapter 3, Oxford: Clarendon Press 1976, pp. 105-125.

Ormoneit, D., et al, "Learning and Tracking Cyclic Human Motion" Proceedings of NIPS 2000 (Neural Information Processing Systems), 2000, Denver, CO, pp. 894-900.

PCT/US2009/044914, International Preliminary Report on Patentability, mailed Mar. 29, 2011, 14 pages.

Weinberg, Harvey, "MEMS Motion Sensors Boost Handset Reliability" Jun. 2006, http://www.mwrf.com/Articles/Print.cfm?ArticleID=12740, Feb. 21, 2007, 4 pages.

"Access and Terminals (AT); Multimedia Message Service (MMS) for PSTN/ISDN; Multimedia Message Communication Between a Fixed Network Multimedia Message Terminal Equipment and a Multimedia Message Service Centre," ETSI AT-F Rapporteur Meeting, Feb. 4-6, 2003, Gothenburg, DES/AT-030023 V0.0.1 (Mar. 2003).

"Decrease Processor Power Consumption using a CoolRunner CPLD," XILINX XAPP347 (v1.0), May 16, 2001, 9 pages.

"Sensor Fusion," <www.u-dynamics.com>, accessed Aug. 29, 2008, 2 pages.

Anderson, Ian, et al, "Shakra: Tracking and Sharing Daily Activity Levels with Unaugmented Mobile Phones," Mobile Netw Appl, Aug. 3, 2007, pp. 185-199.

Ang, Wei Tech, et al, "Zero Phase Filtering for Active Compensation of Period Physiological Motion," Proc 1st IEEE / RAS-EMBS International Conference on Biomedical Robotics and Biomechatronics, Feb. 20-22, 2006, pp. 182-187.

Aylward, Ryan, et al, "Sensemble: A Wireless, Compact, Multi-User Sensor System for Interactive Dance," International Conference on New Interfaces for Musical Expression (NIME06), Jun. 4-8, 2006, pp. 134-139.

Baca, Arnold, et al, "Rapid Feedback Systems for Elite Sports Training," IEEE Pervasive Computing, Oct.-Dec. 2006, pp. 70-76.

Bakhru, Kesh, "A Seamless Tracking Solution for Indoor and Outdoor Position Location," IEEE 16th International Symposium on Personal, Indoor, and Mobile Radio Communications, 2005, pp. 2029-2033.

Bliley, Kara E, et al, "A Miniaturized Low Power Personal Motion Analysis Logger Utilizing MEMS Accelerometers and Low Power Microcontroller," IEEE EMBS Special Topic Conference on Microtechnologies in Medicine and Biology, May 12-15, 2005, pp. 92-93.

Fang, Lei, et al, "Design of a Wireless Assisted Pedestrian Dead Reckoning System—The NavMote Experience," IEEE Transactions on Instrumentation and Measurement, vol. 54, No. 6, Dec. 2005, pp. 2342-2358.

Healey, Jennifer, et al, "Wearable Wellness Monitoring Using ECG and Accelerometer Data," IEEE Int. Symposium on Wearable Computers (ISWC'05), 2005, 2 pages.

Hemmes, Jeffrey, et al, "Lessons Learned Building TeamTrak: An Urban/Outdoor Mobile Testbed," 2007 IEEE Int. Conf. on Wireless Algorithms, Aug. 1-3, 2007, pp. 219-224.

Jones, L, et al, "Wireless Physiological Sensor System for Ambulatory Use," <http://ieeexplore.ieee.org/xpl/freeabs_all.jsp?tp=&arnumber=1612917&isnumber=33861>, Apr. 3-5, 2006.

Jovanov, Emil, et al, "A Wireless Body Area Network of Intelligent Motion Sensors for Computer Assisted Physical Rehabilitation," Journal of NeuroEngineering and Rehabilitation, Mar. 2005, 10 pages.

Kalpaxis, Alex, "Wireless Temporal-Spatial Human Mobility Analysis Using Real-Time Three Dimensional Acceleration Data," IEEE Intl. Multi-Conf. on Computing in Global IT (ICCGI'07), 2007, 7 pages.

Lee, Hyunseok, et al, A Dual Processor Solution for the MAC Layer of a Software Defined Radio Terminal, Advanced Computer Architecture Laboratory, University of Michigan, Apr. 14, 2009, 25 pages.

Milenkovic, Milena, et al, "An Accelerometer-Based Physical Rehabilitation System," IEEE SouthEastern Symposium on System Theory, 2002, pp. 57-60.

Mizell, David, "Using Gravity to Estimate Accelerometer Orientation", Seventh IEEE International Symposium on Wearable Computers, 2003, 2 pages.

Otto, Chris, et al, "System Architecture of a Wireless Body Area Sensor Network for Ubiquitous Health Monitoring," Journal of Mobile Multimedia, vol. 1, No. 4, 2006, pp. 307-326.

Park, Chulsung, et al, "Eco: An Ultra-Compact Low-Power Wireless Sensor Node for Real-Time Motion Monitoring," IEEE Int. Symp. on Information Processing in Sensor Networks, 2005, pp. 398-403.

Ricoh, "Advanced Digital Technology Changes Creativity," <http://www.ricoh.com/r_dc/gx/gx200/features2.html>, Accessed May 12, 2011, 4 pages.

Shen, Chien-Lung, et al, "Wearable Band Using a Fabric-Based Sensor for Exercise ECG Monitoring," IEEE Int. Symp. on Wearable Computers, 2006, 2 pages.

Tapia, Emmanuel Munguia, et al, "Real-Time Recognition of Physical Activities and Their Intensities Using Wireless Accelerometers and a Heart Rate Monitor," IEEE Cont. on Wearable Computers, Oct. 2007, 4 pages.

Tech, Ang Wei, "Real-time Image Stabilizer," <http://www.mae.ntu.edu.sg/Aboutmae/Divisions/RRC_BIOROBOTICS/Pages/rtimage.aspx>, Mar. 23, 2009, 3 pages.

Wang, Shu, et al, "Location Based Services for Mobiles: Technologies and Standards, LG Electronics MobileComm," IEEE ICC 2008, Beijing, pp. 1-66 (part 1 of 3).

Wang, Shu, et al, "Location Based Services for Mobiles: Technologies and Standards, LG Electronics MobileComm," IEEE ICC 2008, Beijing, pp. 67-92 (part 2 of 3).

Wang, Shu, et al, "Location Based Services for Mobiles: Technologies and Standards, LG Electronics MobileComm," IEEE ICC 2008, Beijing, pp. 93-123 (part 3 of 3).

Weckesser, P, et al, "Multiple Sensorprocessing for High-Precision Navigation and Environmental Modeling with a Mobile Robot," IEEE, 1995, pp. 453-458.

Weinberg, Harvey, "Minimizing Power Consumption of iMEMS® Accelerometers," Analog Devices, <http://www.analog.com/static/imported-files/application_notes/59351518533628845 99AN601.pdf>, 2002, 5 pages.

Wixted, Andrew J, et al, "Measurement of Energy Expenditure in Elite Athletes Using MEMS-Based Triaxial Accelerometers," IEEE Sensors Journal, vol. 7, No. 4, Apr. 2007, pp. 481-488.

Wu, Winston H, et al, "Context-Aware Sensing of Physiological Signals," IEEE Int. Conf. on Engineering for Medicine and Biology, Aug. 23-26, 2007, pp. 5271-5275.

Yoo, Chang-Sun, et al, "Low Cost GPS/INS Sensor Fusion System for UAV Navigation," IEEE, 2003, 9 pages.

Zypad WL 1100 Wearable Computer, http://www.eurotech.fi/products/manuals/Zypad%20WL%/201100_sf.pdf, Jan. 16, 2008, 2 pgs.

* cited by examiner

| User Environment | Audio Adjustment Modes |
|---|---|
| Office | Office: Increase microphone gain, place linear filter inline for echo reduction |
| Loud Restaurant | Loud Speaking: Increase speaker gain, apply signal clipping, apply packet loss recovery algorithms |
| Loud Street | Loud Noises: Increase speaker volume, apply noise removal algorithms |
| Jogging | User Loud, High Pitched Noises: Increase microphone gain, increase speaker gain, apply high pass filter. |
| In a moving vehicle | Steady Rumble: Apply low pass filter, apply packet loss recovery |

METHOD AND APPARATUS FOR ADJUSTING AUDIO FOR A USER ENVIRONMENT

RELATED APPLICATION

This patent application claims the benefit under 35 U.S.C. §119(e) of U.S. provisional application No. 61/055,137, filed May 21, 2008, which is incorporated by reference.

FIELD OF THE INVENTION

The present invention relates to adjusting headset or handset audio to a user's environment, and more precisely to adjusting an audio adjustment mode to a current environment.

BACKGROUND

As people are using mobile devices more and more often, noise becomes an issue. People are calling from environments like buses, restaurants, as well as while walking or jogging. Noise affects both mobile handsets as well as the audio headsets that are used with these handsets (both wired and wireless). The ambient noise is becoming more of an issue. There are many factors that contribute to this noise including background machine noise (vehicles, construction equipment, home/lawn equipment, etc.), wind moving over the microphone, wireless device transmission artifacts, echo, interference, etc.

In the prior art, there are some noise reduction mechanisms. However, noise reduction mechanisms have the unfortunate side-effect of reducing sound quality for the voice as well.

SUMMARY

A method and apparatus to define a user environment based on detected motion data and/or ambient noise data is disclosed. The user environment is then used to apply an appropriate audio adjustment mode. In one embodiment, the user environment definition further includes location data. In one embodiment, the location data is obtained from one of: a global positioning system (GPS), and network triangulation.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The method and apparatus described are to add intelligence to an audio adjustment system. The audio adjustment systems can be useful in reducing ambient noise for telephone conversations, increasing volume of the ringer or speaker in a louder environment, and otherwise adjusting the audio input and output for the current environment. However, prior art noise reduction mechanisms are either applied indiscriminately to all conversations, or require user input to control when they are utilized. An unfortunate side-effect of most noise reduction mechanisms is that the voice is altered, clipped, blurred, etc.

The present system applies motion data and ambient noise data to determine when audio adjustment should be utilized, and which audio adjustment mode(s) should be utilized. In one embodiment, location information is also applied. The entire data set, e.g. motion data, ambient noise data, and when available location data, are used to identify a user environment. The user environment information is then used to select an audio adjustment mode. The audio adjustment mode identifies zero, one, or more noise cancellation, noise decreasing, and audio output altering mechanisms that are applied to the device. In one embodiment, the present system may be utilized with any noise cancellation techniques.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 1:
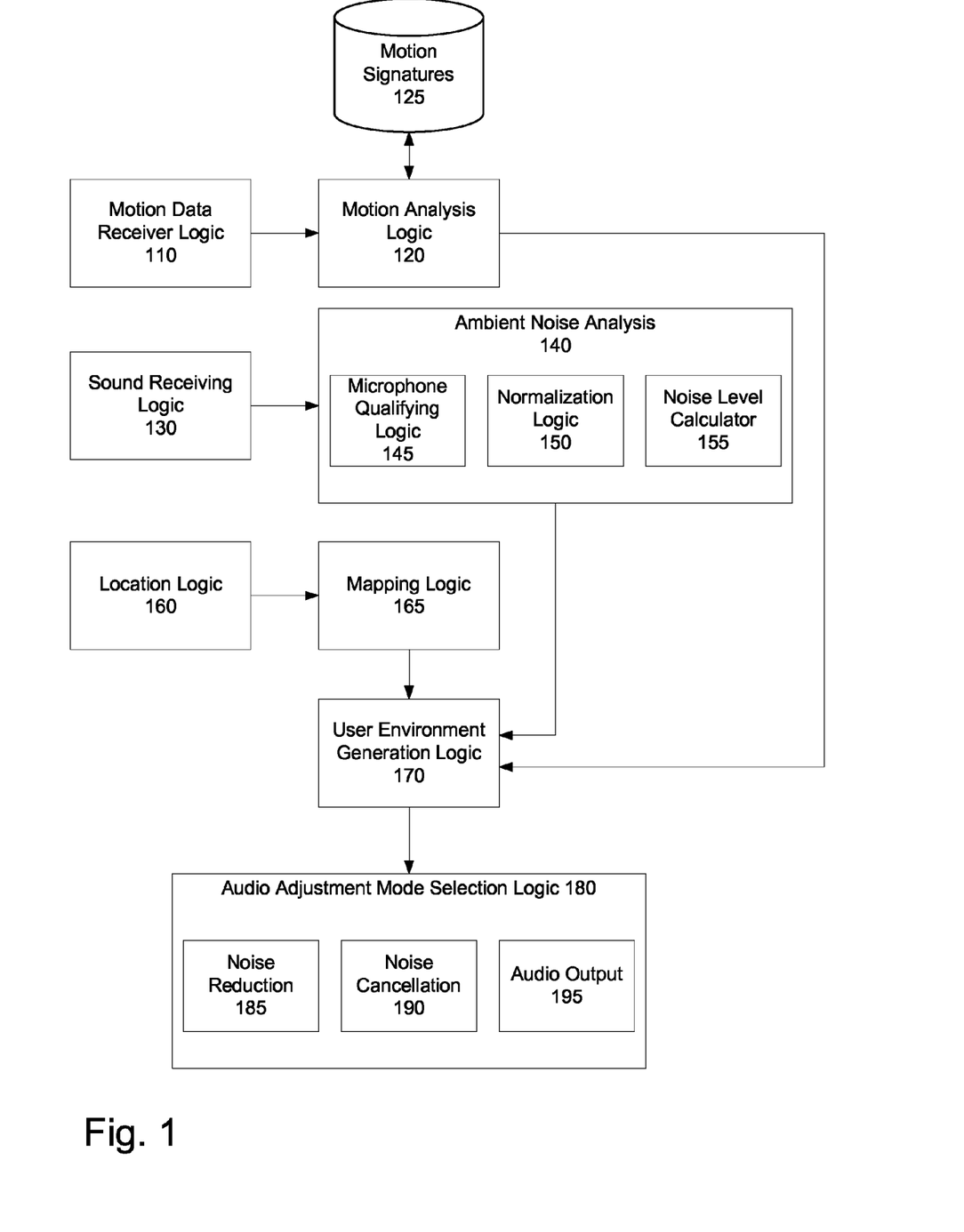
FIG. 1 is a block diagram of one embodiment of the improved environmental response system.

FIG. 1 is a block diagram of one embodiment of the improved environmental response system. In one embodiment, the system is part of a mobile device, which includes a telephone or other communications mechanism. The mobile device may be a mobile phone, a headset coupled to a mobile phone, a Voice-over-Internet Protocol (VoIP) phone, a cordless phone, or another communications mechanism which includes at least one microphone or motion detection system. In one embodiment, the device may further include audio output capability. In another embodiment, the mobile device may not include a communications mechanism, but may instead include only audio output mechanisms, e.g. a speaker. In one embodiment, the environmental response system may include portions located on a mobile device and portions remotely located.

Motion data receiver logic 110 receives motion data. In one embodiment, motion data is received from one or more accelerometers which part of one or more mobile devices which communicate. Motion data is then passed to motion analysis logic 120 in a processor. In one embodiment, motion data is buffered, and the processor obtains the buffered motion data. Motion analysis logic 120 uses the motion data to determine what the user is doing. In one embodiment, motion analysis logic 120 utilizes independent component analysis to analyze motion data for each of the accelerometers. The motion analysis logic 120 then combines the analyzed data to obtain a better result. For example, if there is a separate accelerometer in a headset and in a mobile device coupled to the headset, the motion data from both devices may be combined to get a better indicator of the user's actual activity.

In one embodiment, the motion analysis logic 120 categorizes the user's current activity level. In one embodiment, the motion categories include: laying down, sitting, standing, walking (may differentiate between various speeds, e.g. ambling v. speed walking), running (may differentiate between various speeds), travelling in a vehicle, etc. Note that these are just exemplary categorizations. The system may use any categories which can be identified based on the motion data received. In one embodiment, the motion analysis logic 120 utilizes a database of motion signatures 125, to determine what the user is doing. In one embodiment, the analysis of the motion may be done in accordance with the technique described in co-pending U.S. patent application Ser. No. 12/069,267, titled "Human Activity Monitoring Device with Activity Identification," which is incorporated herein by reference.

The system in one embodiment further includes a sound receiving logic 130. Sound receiving logic 130 receives sound data from one or more microphones or other systems. In one embodiment, the sound receiving logic 130 may receive data from remote microphones (for example a microphone in a headset, while the system is located in a paired handset). The sound data is sent to ambient noise analysis 140. Ambient noise analysis 140 includes a microphone qualifying logic 145. The microphone qualifying logic 145 determines whether the microphone is in close enough vicinity to the user to be relevant to the analysis. If not, the data from the microphone is discarded. This is relevant for example when the microphone is on a handheld device which is located remotely from the user who is wearing a headset. Otherwise, the data from the microphone is passed on to normalization logic 150. Normalization logic 150 normalizes the microphone data to account for different relative locations on the user's body (e.g. worn on the head, in a pocket, in a holster, etc.)

The normalized sound data is then passed to noise level calculator 155, which calculates the actual ambient noise level based on data from all qualified microphones. In one embodiment, the ambient noise level being calculated is ideally at the user's ears, as that is where the user will be hearing a conversation, music, etc.

The system in one embodiment further includes location logic 160. Location logic 160 may receive data from a global positioning system (GPS) receiver, a network triangulation system, dead reckoning based on accelerometer data, or another means of determining an approximate location of the user. In one embodiment, the output of location logic 160 is coordinates identifying the user's current location. Mapping logic 165 converts the coordinate information into location information. In one embodiment, mapping logic 165 then converts the map location information into a location category. In one embodiment, the location category information includes: on a street in a city, on a street in a rural area, inside an office building, inside a restaurant, at a running track, etc. In one embodiment, mapping logic 165 indicates whether the user is inside or outside. In one embodiment, in addition to location data, barometric pressure data and temperature data may be used to confirm whether the user is inside or outside. In general, outside temperatures can be verified in various databases providing local temperature data. Inside temperatures are regulated based on air-conditioning and heating preferences. Thus, temperature data can help differentiate. Similarly, barometric pressure may indicate whether the user is on the ground floor, or at a second floor level or higher, indicating that the user is inside a building.

In one embodiment, location logic 160 receives data from the GPS or other system on a periodic basis. In another embodiment, location logic 160 polls the GPS or other system on a periodic basis. In one embodiment, whenever motion analysis logic 120 has determined that the user has travelled a certain distance, the location logic 160 polls the GPS or other system. In another embodiment, the GPS system may be providing continuous data to the system.

User environment generation logic 170 receives the available ones of the motion data, ambient noise data, and location data. In one embodiment, additional sensors such as pressure monitor (barometric pressure sensor), temperature sensor, or other sensor data may also be included in the analysis. User environment generation logic 170 generates an overall environment evaluation, based on the available data. In one embodiment, the overall environment is a set of variables which are selected based on the available data. In one embodiment, user environment generation logic 170 uses a set of profiles to identify the appropriate environment.

Audio adjustment mode selection logic 180 then receives the user environment, and selects an appropriate audio adjustment mode. The audio adjustment mode may include various noise reduction 185 and noise cancellation 190 mechanisms. The audio adjustment mode may also control the variables for the noise reduction mechanisms. In one embodiment, the audio adjustment mode may also include audio output 195 which can make changes to the output of other sounds. Audio output 195 may be used for adjusting ringer tone, tune, or volume, altering other notifications, or increasing/decreasing speaker volume. Other mechanisms to improve the user's experience in various audio environments may also be part of the audio adjustment modes available to audio adjustment mode selection logic 180.

For example, noise reduction mechanisms may include one or more of the following: a high, low, or bandpass filter (may include variable settings); microphone or speaker gain, noise removal algorithm to remove noise/sounds that have a frequency uncharacteristic of human speech, filters, equalization, signal clipping, smoothing for packet loss.

Noise cancellation mechanisms calculate a reversed version of ambient noise, and apply it to cancel out the noise.

Figure 6:
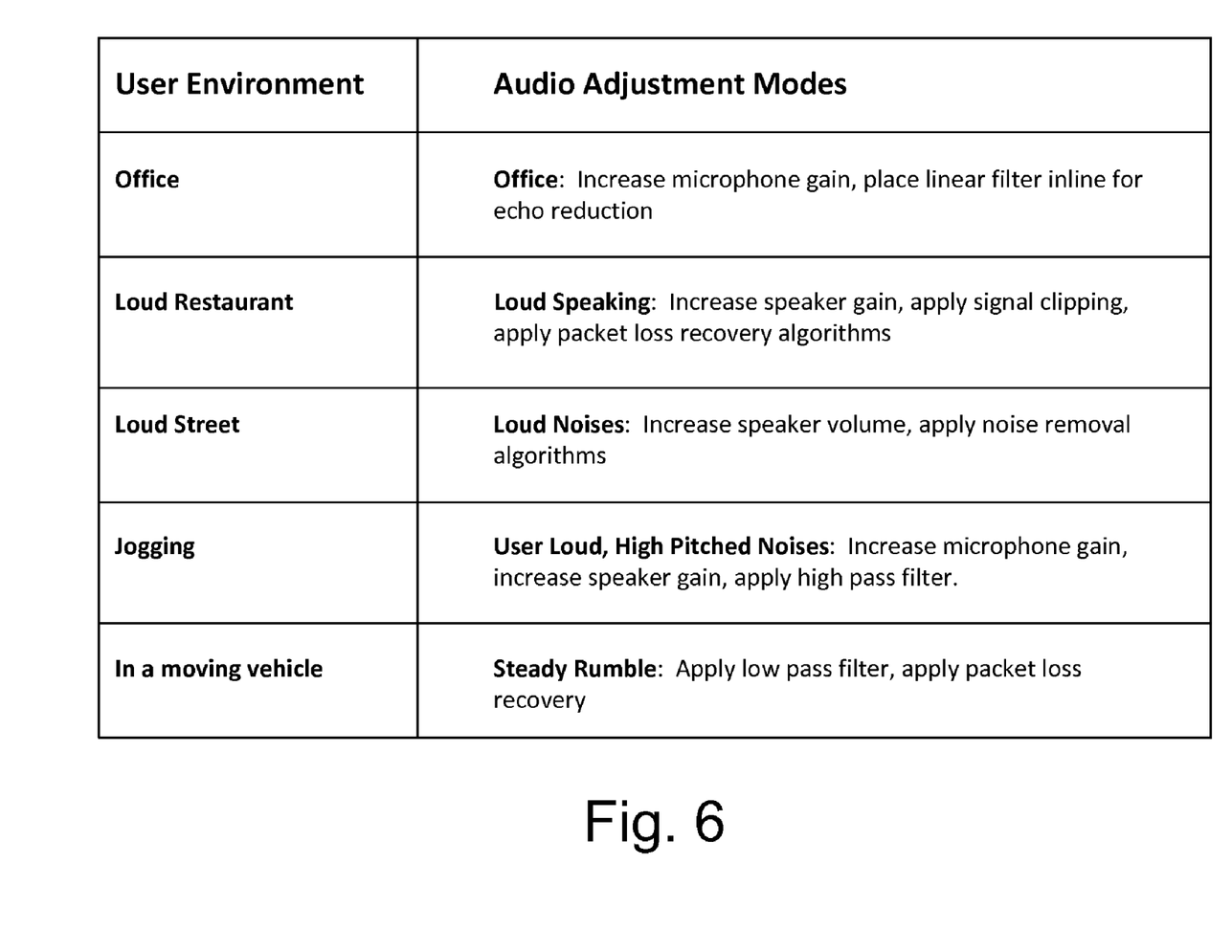
FIG. 6 is an exemplary chart of relating a user environment to a noise reduction

FIG. 6 is an exemplary chart of relating a user environment to an audio adjustment mode. Note that this is simply exemplary. The set of audio adjustment tools which may be available may vary from system to system. The set of audio adjustment modes which may be available can vary from system to system.

Figure 2:
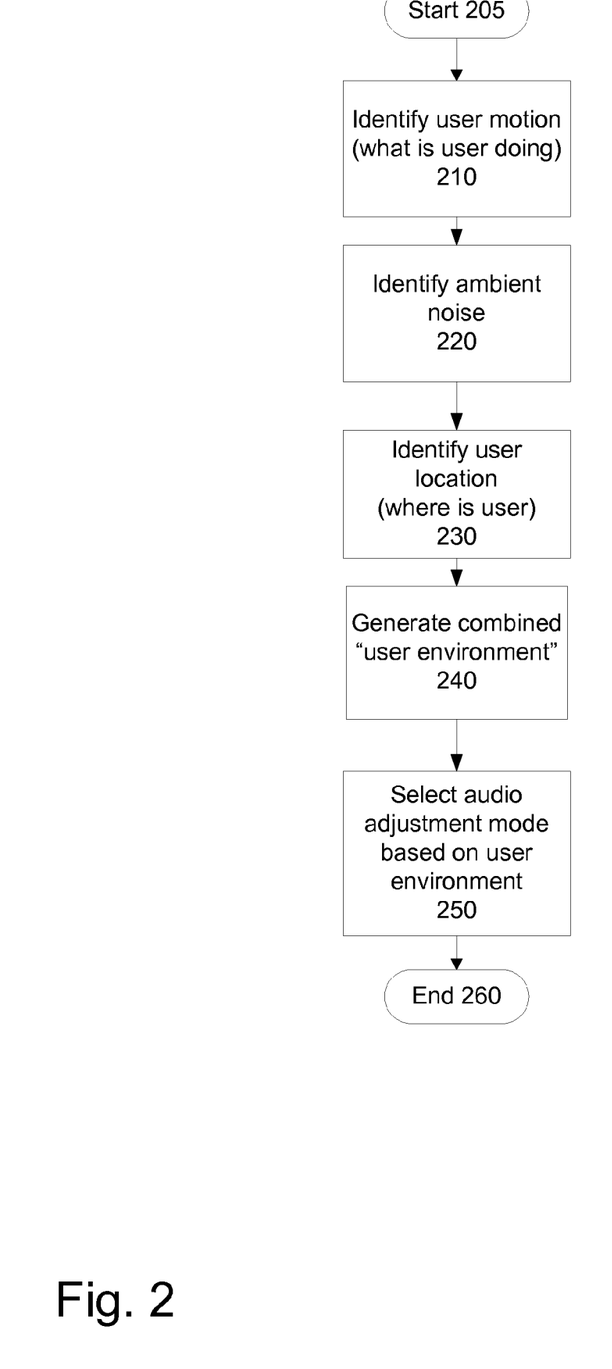
FIG. 2 is a flowchart of one embodiment of the environmental response system.

FIG. 2 is a flowchart of one embodiment of environmental response system. The process starts at block 205. At block 210, the user motion is identified. This is used, in one embodiment, to determine what the user is doing. User motion may be determined based on data from one or more accelerometers. For example, in a mobile system which includes a handset and a headset, one or both may include accelerometers. The accelerometer data, in one embodiment from both devices when available, is utilized to identify the user motion.

At block 220, the ambient noise level is identified. The ambient noise level, in one embodiment, includes all noises detected by a microphone. In one embodiment, multiple microphones may be used.

At block 230, in one embodiment, the user location is identified. In one embodiment, this feature is available when a location identification tool is available within the system. This step may be skipped, if no location information is available. User location data may be an address, or an indication that the user is inside a building or outside.

At block 240, a combined "user environment" data set is generated. The user environment data may include information from other available sensors. For example, in one embodiment, the user environment data may include information from one or more of the following sensors: clock, camera, temperature sensor, barometer, heart rate. Any sensor which may be used to gauge a user's environment may be part of the combined "user environment" data.

At block 250, an audio adjustment mode is selected, based on the identified user environment. The audio adjustment mode may include one or more noise cancellation algorithms and/or settings for algorithms, one or more noise reduction algorithms and/or settings for algorithms, and adjustments in audio output. In one embodiment, one mode is to have no changes made.

The process then ends at block 260. In one embodiment, this monitoring occurs continuously. In one embodiment, a "user environment" evaluation occurs continuously. In another embodiment, the system monitors the user's environment periodically. In one embodiment, whenever a change is detected—e.g. substantial movement by the user, a change beyond a set range in any of the sensor outputs—the user's environment is reevaluated. In another embodiment, the system monitors only when there is an active call in progress, the user is listening to the device, or when there is other activity with the device which makes audio input and/or output adjustment relevant.

Figure 3:
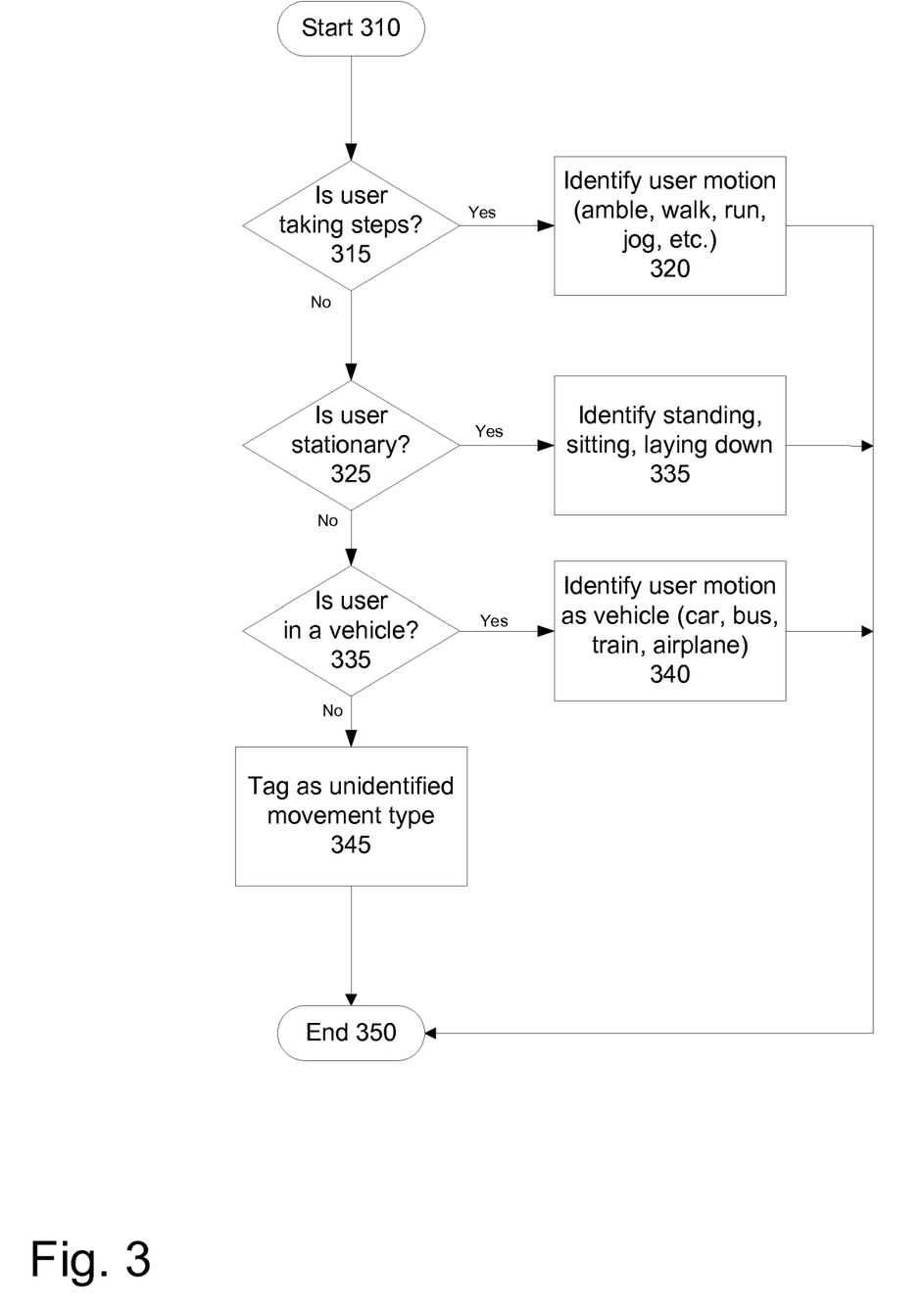
FIG. 3 is a flowchart of one embodiment of identifying user motion.

FIG. 3 is a flowchart of one embodiment of identifying user motion. As noted above, this may be done using one or more accelerometers, or other motion detection mechanisms. The process starts at block 310. At block 315, the process determines whether the user is taking steps. In one embodiment, a step detection system may be used.

If the user is taking steps, the process continues to block 320. At block 320, the type of steps being taken is identified. In one embodiment, the system can detect the difference between a leisurely amble, a walk, a jog, a sprint, and other types of steps that the user can take. The various types of steps indicate various modes of travel. For example, a user who is jogging has a different environment than one who is ambling, from a noise perspective. In one embodiment, the algorithm described in co-pending application Ser. No. 12/069,267 is used. The algorithm in one embodiment determines the cadence and speed of the user. For example, the optimal noise reduction mode for a user who is running is different from the optimal mode for a user who is walking at a slow pace. For example, the user's speed generates wind over the microphone and thus noise. The process then ends at block 350.

If the user was found not to be taking steps, the process continues to block 325. At block 325, if possible, the process determines whether the user is stationary. A stationary user is one that is not travelling. In one embodiment, a user who is not moving by a certain minimum amount is considered stationary. That is, a user who is shifting from one foot to another, while not moving, is considered a stationary user. In one embodiment, stationary users are generally standing or sitting. At block 330, the process determines whether the user is standing or sitting. In one embodiment, the system can also determine if the user is lying down. While sitting down, a user's waist area is moving in quite a different manner than while standing up.

In one embodiment, the determination is made based on minute motions made by the user's body. In one embodiment, this determination may be made using multiple accelerometers. In that instance, for example if there is an accelerometer in a headset and a handset worn at the waist. The process then ends at block 350.

If the user was not determined to be stationary, the process continues to block 335. At block 335, the process determines whether the user is in a vehicle. Vehicle motion has certain characteristics. The accelerations in a moving vehicle are quite characteristic. If the user is in a vehicle, the process continues to block 340. At block 340, the vehicle is identified, if possible. Generally, the driving characteristics of various vehicles differ. For example, a train has no side-to-side movement compared to a car. Once the vehicle is identified, the process ends at block 350.

In one embodiment, any other patterns that are known or developed can be utilized to attempt to identify the type of motion the user is undergoing at this time. However, if no motion is identified—or in one embodiment if no motion data is available—the process assigns an unidentified motion type to the detected motion at block 345. The process then ends at block 350. In one embodiment, this process is continuously evaluated, when the system is in operation.

Figure 4:
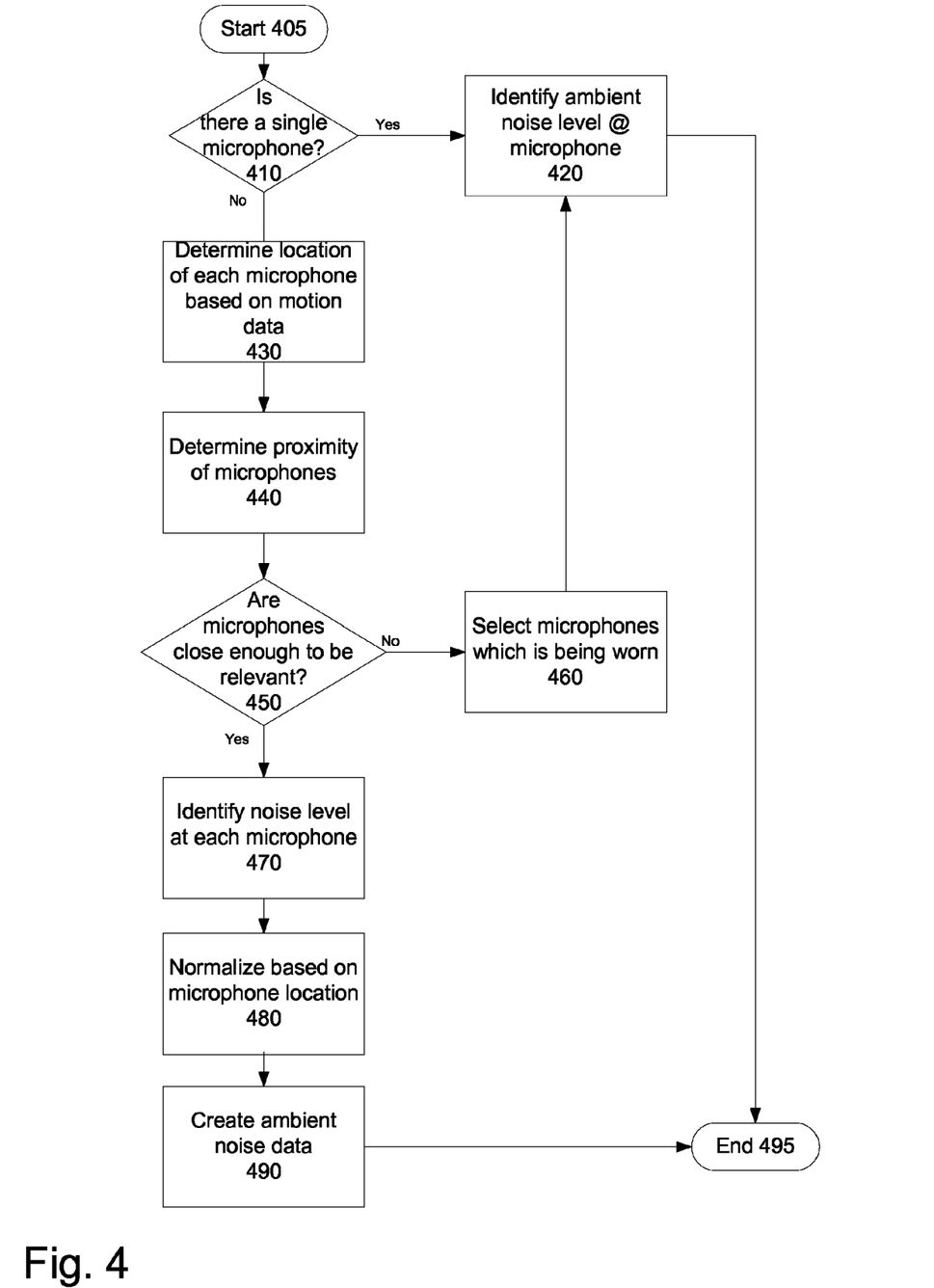
FIG. 4 is a flowchart of one embodiment of identifying ambient noise.

FIG. 4 is a flowchart of one embodiment of identifying ambient noise. The process starts at block 405. In one embodiment, this process is activated only when there is at least one available microphone that can be used to measure ambient noise levels. At block 410, the process determines if there is a single microphone. If there is a single microphone, at block 420, the ambient noise level at the microphone is identified as the overall ambient noise level. The process then ends at block 495.

If there is more than one microphone, the process continues to block 430. There may be more than one microphone when there is, for example, a handset including a telephone and a Bluetooth connected headset including a microphone.

At block 440, the location of each microphone is identified based on location data. In one embodiment, location on or off the user's body is relevant in order to calculate the relevant ambient noise for any conversation.

At block 450, the process determines whether the microphones are close enough to be relevant. In one embodiment, since the devices including the microphones are linked in some wireless manner, a wireless packet may be sent to determine the microphone's proximity. Since the speed that such packets travel is known, by exchanging a set of packets, the processing mechanism can determine the distance between the microphones. If the microphones are not both close enough to be relevant, the process continues to block 460. At block 460, the microphone associated with the element that is worn by the user (e.g. the headset or handset or other device) is selected. The process then continues to block 420, to identify the ambient noise level at the selected microphone. In this way, when the two portions of the device are separated, the system selects the appropriate device to determine actual ambient noise in the vicinity of the user. In one embodiment, the multiple microphones are contained within the headset and situated in different directions.

If the microphones were close enough to be relevant, at block 450, the process continues to block 470. At block 470, an ambient noise level at each microphone is identified.

At block 480, the noise level data is normalized. For example, a device in a backpack worn by the user would detect a different ambient noise level than a headset worn by the same user. The location data—determined above—would be used, in one embodiment, to identify a basis for normalization.

At block 490, the normalized noise levels are used to create an ambient noise level. The ambient noise level corresponds to a noise level not including the user's own contribution. The process then ends at block 495

Figure 5:
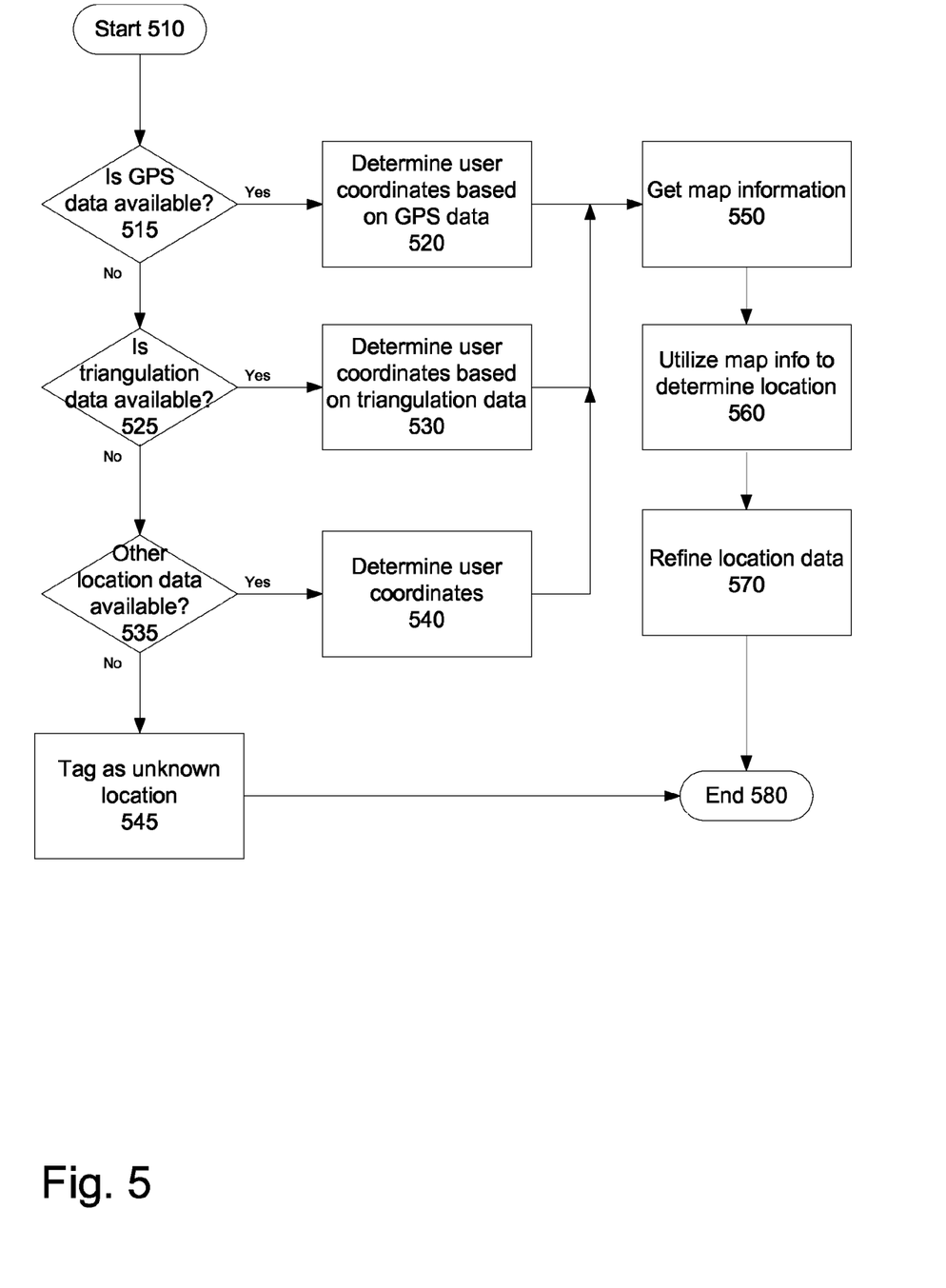
FIG. 5 is a flowchart of one embodiment of identifying location.

FIG. 5 is a flowchart of one embodiment of identifying location. The process starts at block 510. In one embodiment, this process occurs only if the environmental response system generally includes location capability. If the environmental response system doesn't include location capability at all, this process would not start.

At block 515, the process determines if GPS data is available. If so, at block 520, the user's coordinates are determined based on GPS data. At block 550, map information is obtained based on the coordinate information. In one embodiment, the mapping data may be part of the system. In another embodiment, the mapping data may be obtained from an external source. At block 560, mapping data is used to determine the user's location. The user's location may be on a street, in a restaurant, at a running track, etc.

At block 570, other sensor data is used to refine location data. Other sensors may include barometric sensors, which can indicate when a user is on a higher floor of a building. Other sensors may also include temperature sensors, which can indicate whether the user is in the open environment or in a heated or air-conditioned location (e.g. inside.).

If no GPS data is available, at block 525 the process determines whether network triangulation data is available. If so, at block 530, the user's coordinates are determined based on triangulation data. The process then continues to block 550 to obtain location from the triangulation data.

If no triangulation data is available, the process continues to block 535. At block 535, the process determines whether an alternate location determination system is available. If so, location data, coordination or other data, is obtained at block 540. If the data is coordinate data, or other data which requires conversion, the process continues to block 550, to obtain location information.

If no location determination system is available, the process tags the location as unknown at block 545. This would generally mean that no GPS or triangulation data is available, although the systems are available. The process then ends at block 580.

In one embodiment, this process actually doesn't flow in this way, but rather whatever system, or systems, are available, are utilized to obtain location information. In one embodiment, whenever the location determination mechanism receives incoming data—e.g. triangulation data, GPS data, or other data—an updated location is calculated. In one embodiment, the system may use these separate tools in combination to improve the coordinate quality.

FIG. 6 shows some possible adjustment modes which may be created, and the associated alterations to the input/output. For example, the modes may include: in office, in restaurant, on street, jogging, in car, etc. Each of these modes describes a particular set of local noise effects. For example, an office is generally relatively quiet, has other speakers, and echoes. In contrast, someone jogging is likely not going to be hearing as well (loud heart beat, and foot), but it is relatively unlikely to be hearing other speakers or experiencing echoes. These factors can be corrected-for.

Figure 7:
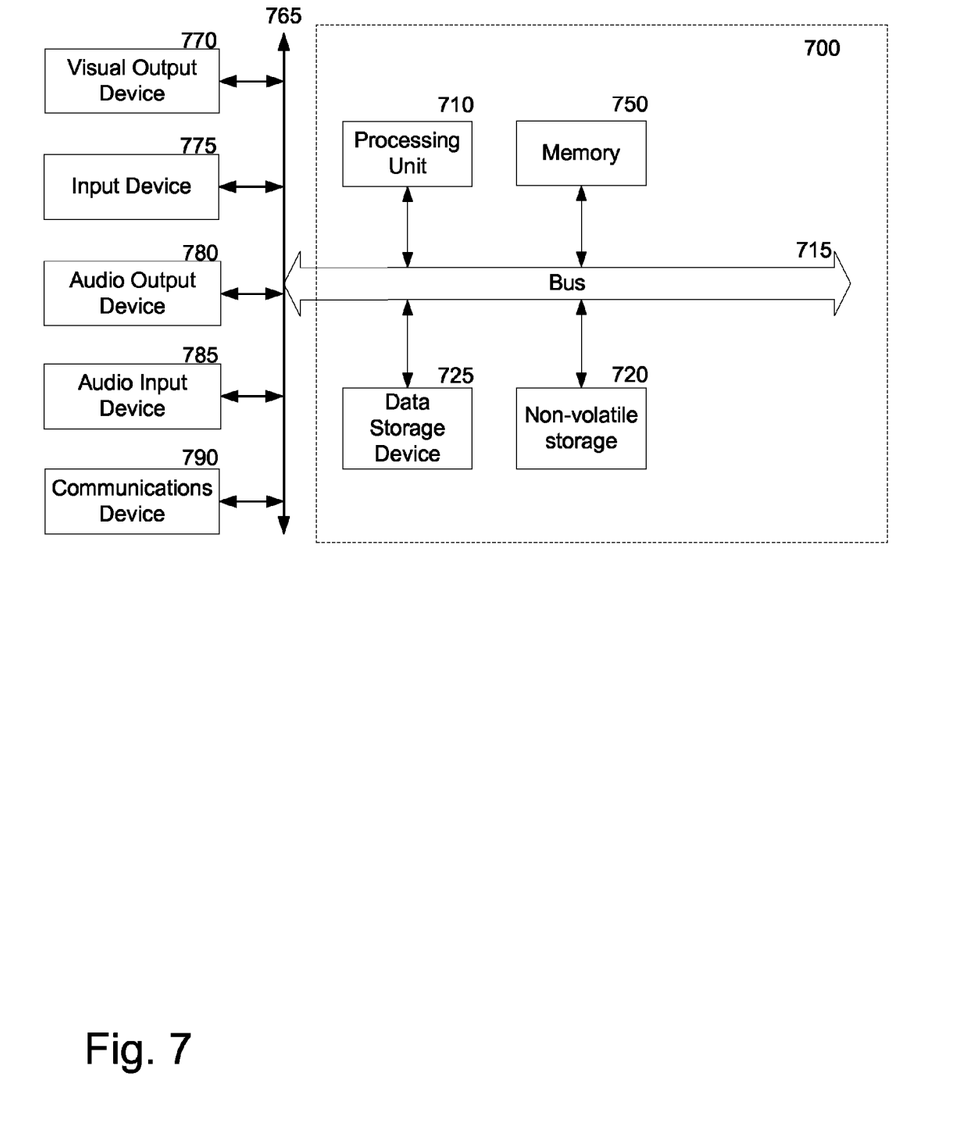
FIG. 7 is a block diagram of one embodiment of the processing system which may be used to implement the environmental response system.

FIG. 7 is a block diagram of a computer system which may be used in the present invention. The block diagram may apply to a mobile device, which is carried by the user.

The specific machine illustrated in FIG. 7 includes a bus or other internal communication means 715 for communicating information, and a processor 710 coupled to the bus 715 for processing information. The system further comprises a random access memory (RAM) or other volatile storage device 750 (referred to as memory), coupled to bus 715 for storing information and instructions to be executed by processor 710. Main memory 750 also may be used for storing temporary variables or other intermediate information during execution of instructions by processor 710. The system also comprises a read only memory (ROM) and/or static storage device 720 coupled to bus 715 for storing static information and instructions for processor 710, and a data storage device 725 such as a magnetic disk, optical disk and its corresponding disk drive, or flash memory. Data storage device 725 is coupled to bus 715 for storing information and instructions. In one embodiment, the accelerometer data and other temporary data are stored in main memory 750, which data such as motion characteristics are stored in static storage device 720.

The system may further be coupled to a visual display device 770, such as a cathode ray tube (CRT) or a liquid crystal display (LCD) coupled to bus 715 through bus 765 for displaying information to a computer user. An input device 775, which in one embodiment may include alphanumeric and other keys, may also be coupled to bus 715 through bus 765 for communicating information and command selections to processor 710. Input device 770 may also include cursor control device 780 for controlling cursor movement on display device 770.

Audio output device 780 is designed to output sounds, for example music or conversation. Audio output device 780 in general is a speaker, including volume adjusting mechanisms. Audio output device 780 in one embodiment includes various structures such as filters (bandpass, bandgap, high pass, low pass, linear filter) to alter the sound quality being output. Audio output device 780 in one embodiment further includes controls to provide for packet loss recovery. In another embodiment, these mechanisms are provided via processor 710, and applied to audio output device 780.

Audio input device 785 is designed to receive sounds from the user. In one embodiment, audio input device 785 is designed to receive data, and the data is packetized by processor 710, and transmitted via communication device 790. Audio input device 785 in one embodiment is a microphone or other receiver. In one embodiment, audio input device 785 includes filters (linear filter, bandpass, bandgap, high pass, low pass) to remove extraneous noise from the sound received. In one embodiment, audio input device 785 also incorporates signal clipping, adjustment of gain, and adjusting of volume. In another embodiment, these mechanisms are provided via processor 710, and applied to audio input device 785.

Another device, which may optionally be coupled to computer system 700, is a communication device 790 for accessing other nodes of a distributed system via a network. The communication device 790 may include any of a number of commercially available networking peripheral devices such as those used for coupling to an Ethernet, token ring, Internet, personal area network (PAN), cellular network, wireless network, or other network. The communication device 790 may further be a null-modem connection, or any other mechanism that provides connectivity between the computer system 700 and the outside world. Note that any or all of the components of this system illustrated in FIG. 7 and associated hardware may be used in various embodiments of the present invention.

It will be appreciated by those of ordinary skill in the art that any configuration of the system may be used for various purposes according to the particular implementation. The control logic or software implementing the present invention can be stored in main memory 750, mass storage device 725, or other storage medium locally or remotely accessible to processor 710.

It will be apparent to those of ordinary skill in the art that the system, method, and process described herein can be implemented as software stored in main memory 750 or read only memory 720 and executed by processor 710. This control logic or software may also be resident on an article of manufacture comprising a computer readable medium having computer readable program code embodied therein and being readable by the mass storage device 725 and for causing the processor 710 to operate in accordance with the methods and teachings herein.

The present invention may also be embodied in a handheld or portable device containing a subset of the computer hardware components described above. For example, the handheld device may be configured to contain only the bus 715, the processor 710, and memory 750 and/or 725, and audio output 780 and input 785 devices. The handheld device may also be configured to include a set of buttons or input signaling components with which a user may select from a set of available options. The handheld device may also be configured to include an output apparatus such as a liquid crystal display (LCD) or display element matrix for displaying information to a user of the handheld device. The implementation of the present invention for such a device would be apparent to one of ordinary skill in the art given the disclosure of the present invention as provided herein.

The present invention may also be embodied in a special purpose device, such as a headset, including a subset of the computer hardware components described above. For example, the headset may include a processor 710, a data storage device 725, a bus 715, and memory 750, and only rudimentary communications mechanisms, such as audio input and output that permits the user to communicate in a basic manner with the device. In general, the more special-purpose the device is, the fewer of the elements need be present for the device to function. In some devices, communications with the user may be through a voice based system, or similar mechanism.

It will be appreciated by those of ordinary skill in the art that any configuration of the system may be used for various purposes according to the particular implementation. The control logic or software implementing the present invention can be stored on any machine-readable medium locally or remotely accessible to processor 710. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (e.g. carrier waves, infrared signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method and to define a user environment comprising:
   detecting motion data;
   detecting ambient noise data;
   identifying a user environment based on the motion data and the ambient noise data, wherein the user environment is selected from a plurality of predefined environments, each predefined environment associated with a certain user activity level, ambient noise data, and location data when available; and
   selecting an appropriate audio input and output adjustment mode based on the selected user environment data.

2. The method of claim 1, further comprising:
   detecting location data; and
   utilizing the location data in defining the user environment.

3. The method of claim 2, wherein the location data is obtained from one of: a global positioning system (GPS), and network triangulation.

4. The method of claim 2, wherein detecting location data comprises:
   receiving coordinate data from a location sensor; and
   mapping the coordinate data onto a map to determine the location data.

5. The method of claim 2, wherein detecting location data comprises:
   determining whether a user is in an inside environment or an outside environment, based on one or more of: temperature data, barometer data, global positioning.

6. The method of claim 1, wherein the audio input adjustment mode includes one or more of the following: noise reduction, noise cancellation, and audio output adjustment mode includes one or more of: speaker adjustment, and audio output mode selection.

7. The method of claim 1, wherein the defined environments comprise: in office, on street, in moving vehicle, at exercise, in home, in restaurant or store.

8. The method of claim 1, wherein the user environment is identified continuously during a telephone call, and a change in the predefined environment results in adjusting an audio input and/or an audio output to improve communication quality based on the user environment.

9. A mobile device comprising:
   a motion data receiver logic to receive motion data;
   a sound receiving logic to receive ambient noise data;
   a user environment generation logic to identify a user environment associated with the mobile device based on a user activity level based on the motion data, the ambient noise data, and location information when available, the user environment being one of a plurality of predefined environments; and
   an audio adjustment mode selection logic to select an appropriate adjustment to be applied to an audio output and an audio input of the mobile device based on the identified environment.

10. The mobile device of claim 9, further comprising:
   a motion analysis logic to categorize how a user is using the mobile device based on the motion data; and
   a memory coupled with the motion analysis logic to store one or more motion signatures, each motion signature associated with a category of user motion.

11. The mobile device of claim 10, further comprising:
   the motion analysis logic to receive motion data from two or more motion sensing components, analyze motion data associated with each of the motion sensing components, and combine the analyzed motion data before determining how a user is using the mobile device.

12. The mobile device of claim 9, further comprising:
   an ambient noise analysis logic to determine whether one or more microphones coupled with the mobile device are relevant to identifying a user environment,
   when a plurality of microphones are identified as relevant, a normalization logic to normalize microphone data based on a relative location with respect to a user's ear of the plurality of microphones, and a noise level calculator to calculate an ambient noise level based on data from all microphones that have been determined relevant.

13. The mobile device of claim 9, further comprising:
a location logic to receive location data from one of a global positioning system (GPS) and network triangulation; and
a mapping logic coupled with the location logic to convert the location data to a location, and to provide the location to the user environment generation logic.

14. The mobile device of claim 9, further comprising:
the user environment generation logic to receive additional environmental data from one or more of a pressure monitor and a temperature sensor to evaluate when identifying the user environment.

15. The mobile device of claim 9, wherein the adjustment to be applied to the audio input of mobile device includes one or more of the following: noise reduction, noise cancellation, and/or the adjustment applied to the audio output includes one or more of: speaker adjustment, and audio output mode selection.

16. The apparatus of claim 9, wherein the defined environments comprise one of: in office, on street, in moving vehicle, at exercise, in home, in restaurant or store.

17. The apparatus of claim 9, wherein the user environment generation logic determines changes to the user environment during a telephone call made with the mobile device, such that the audio adjustment mode selection logic changes the appropriate adjustment during the telephone call, when the predefined environment changes.

18. An apparatus comprising:
an accelerometer to receive motion data, and send the motion data to a motion data receiver logic;
a processor to classify a user environment as one of a plurality of possible predefined environments based on user activity data based on the motion data and ambient noise data detected by the apparatus and location data; and
a speaker capable of adjustment, and the processor to adjust the speaker volume based on the classification of the user environment; and
a microphone to receive sound from the user, the microphone capable of being adjusted based on the classification of the user environment.

19. The apparatus of claim 18, further comprising;
a filter to adjust a sound response of the speaker, based on the user environment.

20. The apparatus of claim 19, wherein the filter is one of: a low pass filter, a high pass filter, and band pass filter, and a band gap filter, and further,
where the filter is implemented as one of: a hardware filter connected inline, a software filter implemented by the processor, and a combination of hardware and software element.

21. The apparatus of claim 18, further comprising:
a global positioning system (GPS) receiver to receive GPS data; and
the processor to adjust the user environment based on the GPS data.

22. The apparatus of claim 18, further comprising:
the processor monitoring for changes in the user environment during a telephone call, and changes the appropriate adjustment during the telephone phone call when the predefined environment changes.

* * * * *